(12) United States Patent
Terryn et al.

(10) Patent No.: US 7,692,484 B2
(45) Date of Patent: Apr. 6, 2010

(54) BANDWIDTH CALIBRATION OF ACTIVE FILTER

(75) Inventors: Steven Terryn, Leuven (BE); Dieter Joos, Mechelen (BE)

(73) Assignee: STMicroelectronics Belgium NV, Zaventem (BE)

( * ) Notice: Subject to any disclaimer, the term of this patent is extended or adjusted under 35 U.S.C. 154(b) by 0 days.

(21) Appl. No.: 11/588,107

(22) Filed: Oct. 26, 2006

(65) Prior Publication Data

US 2008/0100373 A1    May 1, 2008

(51) Int. Cl.
*H03K 5/00* (2006.01)
(52) U.S. Cl. .................................. 327/553; 327/552
(58) Field of Classification Search .......... 327/551–559
See application file for complete search history.

(56) References Cited

U.S. PATENT DOCUMENTS

| | | | | |
|---|---|---|---|---|
| 4,835,490 A | * | 5/1989 | Mazzucco et al. .......... 330/285 |
| 5,929,699 A | * | 7/1999 | Lewicki ..................... 327/552 |
| 6,239,654 B1 | * | 5/2001 | Yamamoto .................. 330/9 |
| 6,452,443 B1 | * | 9/2002 | Thompson et al. ......... 327/553 |

* cited by examiner

*Primary Examiner*—Dinh T. Le
(74) *Attorney, Agent, or Firm*—Lisa K. Jorgenson; James H. Morris; Wolf, Greenfield & Sacks, P.C.

(57) ABSTRACT

An active RC filter has an op-amp and a biasing circuit arranged to bias the op-amp to set a gain bandwidth product of the op-amp according to a desired pole frequency of the filter. The biasing circuit is operable according to an output of an RC calibration circuit. The op-amp can be an OTA transconductance amplifier, and the biasing circuit can be arranged to maintain a constant product of R and transconductance at an input of the transconductance amplifier. This biasing can help to set the pole frequency more accurately and can thus reduce the need for bandwidth margin to be provided to allow for manufacturing process variations.

20 Claims, 2 Drawing Sheets

BANDWIDTH CALIBRATION OF ACTIVE FILTER

BACKGROUND OF THE INVENTION

1. Field of the Invention

This invention relates to active filters, to methods of calibration, and to corresponding software and integrated circuits.

2. Discussion of the Related Art

It is known to provide active filters using op-amps (operational amplifiers) with feedback. In general such a filter is illustrated in FIG. 1a in a negative feedback arrangement. This shows an op-amp, an input resistor R2, and a feedback resistor R1 coupled from the op-amp output to the op-amp negative input. Typically R1=R2 and both have a resistance value R, but other arrangements are possible. A capacitor C1 is coupled in parallel with the feedback resistor. It is known to use OTAs (Operational transconductance amplifiers) in such filters. The OTA is a voltage-controlled current source whereas a conventional op-amp is a voltage-controlled voltage source. The OTA is similar to a standard op-amp in that it has a high impedance differential input stage and that it may be used with negative feedback. An additional input for a current ($I_{abc}$) can be provided to control the amplifier's transconductance. The OTA has both inverting and noninverting inputs; power supply lines and a single output as well as the additional biasing input, $I_{abc}$. Optionally, a further biasing input $I_{bias}$—see FIG. 1b—can be provided. As depicted in the figure, the transconductance of the amplifier is controlled by the input current $I_{abc}$ ("amplifier bias current"). The amplifier's transconductance is directly proportional to this current. Optionally, as also depicted in the figure, the internal design of the OTA includes diodes whereby the anodes of the diodes are attached together and the cathode of one is attached to the non inverting input and the cathode of the other to the inverting input. The diodes are biased at the anodes by a current ($I_{bias}$) that is injected into the $I_{bias}$ terminal. These biasing currents make two substantial improvements to the OTA. Firstly, when used with input resistors, the diodes distort the differential input voltage to offset a significant amount of input stage non linearity at higher differential input voltages. Secondly, the action of the biased diodes offsets much of the temperature sensitivity of the OTA's transconductance.

An OTA can enable filter circuits with voltage-variable control of the midband gain of the circuit, or external bias setting can be used to control the center frequency, or 3-dB frequency, or shape of response, in a filter. For RC filters, it is known that there will be variations in the values due to manufacturing tolerances. Since the pole frequency is mainly determined by the product R×C of such a filter, this product needs to be calibrated. Hence, it is known to reduce the amount of variation by providing an RC calibration circuit. However not all effects are compensated so that it is known to provide a margin of error in the system having the filter. For example, the gain bandwidth of the OTA has an effect on the pole frequency and so it is known to provide a margin of safety e.g. to allow for a variation in the gain bandwidth of the OTA between devices. Providing a margin of safety can result in extra semiconductor/chip area and power consumption. For example, the gain bandwidth of the op-amp can be made so large that there is little effect on the filter pole (so that variations do not matter) but this results in higher current consumption.

SUMMARY OF THE INVENTION

An object of the invention is to provide improved active filters, methods of calibration, and corresponding software and integrated circuits. An advantage of the present invention is to reduce pole frequency variation in an active filter, e.g. an RC filter, between devices. One aspect of the invention calibrates the gain bandwidth of the op-amp either with existing calibration circuits or with a further calibration circuit. Hence one aspect of the present invention is to control the bandwidth of an active filter. For example, a biasing circuit is used to fix the gain bandwidth product, which reduces variations on the filter pole frequency. The following is done: In the RC-calibration circuitry, the capacitance value is (digitally) changed to calibrate the product (R)(C). These calibration bits are used to change the capacitance values in the filter so as to keep there also the product (R)(C) constant.

In one aspect of the present invention, use is made of the same adjustment or calibration information, e.g. a number of bits, to alter a resistor in biasing circuitry of an amplifier, e.g. an opamp, to keep the GBW (=Gm/C) of the amplifier, e.g. opamp, constant, which benefits, therefore, the filter design.

This provides the advantage of a lower gain bandwidth without the need to provide safety margins to allow for manufacturing and other tolerances. At least some of these advantages can be obtained without requiring additional calibration circuitry. Another advantage of embodiments of the present invention is to have a low, or to reduce, power consumption of the filter, e.g. current consumption. This can be achieved by reusing values obtained from an existing calibration circuit in a circuit for calibrating the gain bandwidth. According to an aspect, the invention provides:

An active filter having an input stage having an amplifier such as an operational amplifier and a biasing circuit arranged to bias the input stage, e.g. the amplifier to set and/or maintain a gain bandwidth product of the input stage, e.g. the amplifier, to obtain a desired pole frequency of the filter.

This can help to set the pole frequency more accurately and can thus reduce the need for bandwidth margin to be provided to allow, for example, for manufacturing process variations in gain-bandwidth product.

The present invention also provides a method of calibrating an active filter having an input stage having an amplifier such as an operational amplifier and a biasing circuit arranged to bias the input stage, e.g. the amplifier, the method comprising setting and/or maintaining a gain bandwidth product of the input stage, e.g. of the amplifier, to obtain a desired pole frequency of the filter or to obtain a pole frequency within a desired range.

In particular the present invention relates to an active filter having an input stage with an amplifier such as an opamp and a biasing circuit for biasing the input stage, e.g. the amplifier to set a gain bandwidth product of the input stage, e.g. of the op-amp, to a desired value or within a desired range.

The active filter can be an RC filter having an RC calibration circuit for tuning an (R)(C) product. Preferably, the biasing circuit is operable according to an output of the RC calibration circuit to thereby bias the input stage, e.g. the amplifier.

This has the advantage that the same calibration information for the RC filter is reused for setting the bandwidth of the input stage, e.g. amplifier.

The amplifier may comprise a transconductance amplifier, and the biasing circuit can maintain a product of feedback resistance (R1) and transconductance at an input of the transconductance amplifier to a constant value or within a range or can maintain a value of transconductance at an input of the transconductance amplifier divided by the capacitance thereof to a constant value or within a range.

The biasing circuit may comprise a current generator for generating a bias current to be supplied to the input stage.

The input stage, e.g. the op-amp, has a GBW proportioned to transconductance divided by capacitance (C1), and the biasing circuit preferably maintains the transconductance divided by the capacitance (C1) at a constant value or within a range.

The biasing circuit may have a tunable resistor (Rv) tunable according to a calibration signal obtained from the RC calibration circuit.

The present invention also includes an integrated circuit having the active filter as described above.

The present invention also includes a method of calibrating an active filter having an input stage with an amplifier, e.g., an op-amp, and a biasing circuit arranged to bias a gain bandwidth product of the input stage, e.g., of the op-amp, the method comprising the step of controlling the bias circuit to set the product of gain and bandwidth of the input stage, e.g., of the op-amp, to a desired value or within a desired range.

The active filter can be an RC filter and have an RC calibration circuit for tuning an (R)(C) product, the method further including operating the biasing circuit according to an output of the RC calibration circuit.

The input stage may have a transconductance, and the method may further comprise maintaining a product of feedback resistance and transconductance at the input stage to a constant value or within a range.

Alternatively, the input stage may have a transconductance, the method further comprising maintaining a ratio of a transconductance at the input stage to a capacitance at a constant value or within a desired range.

The method may include supplying a bias current to the input stage. The input stage may have a GBW proportioned to a transconductance divided by a capacitance, the method further comprising supplying a bias current to the input stage to maintain the transconductance divided by the capacitance to a constant value or within a range.

The biasing circuit may have a tunable resistor, the method further comprising tuning the tunable resistor according to the calibration signal obtained from the RC calibration circuit.

The input stage may have a GBW proportioned to transconductance divided by a capacitance, the method further comprising maintaining the transconductance divided by a capacitance to a constant value or within a range in dependency on the calibration signal.

Other or alternative advantages can be envisaged. Any features can be added to those set out above, and some additional features are described and claimed below.

Another aspect of the invention provides a method of calibrating an active filter.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which.

DETAILED DESCRIPTION

Figure 1A:
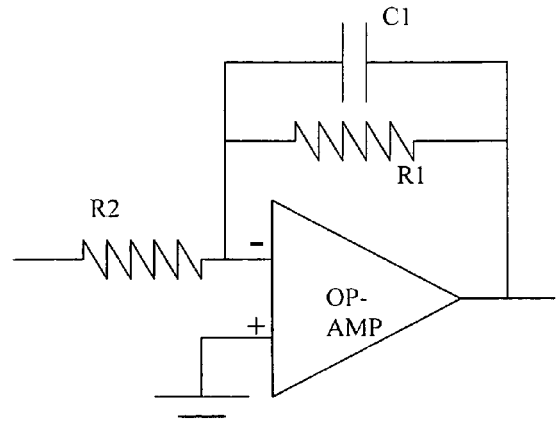
FIG. 1a shows an active filter.

The present invention will be described with respect to particular embodiments and with reference to certain drawings but the invention is not limited thereto, but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Figure 1B:
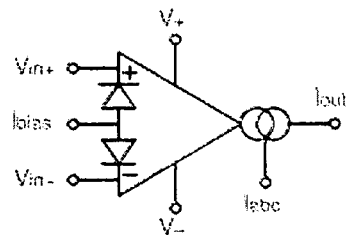
FIG. 1b is a schematic representation of an OTA.
Figure 1C:
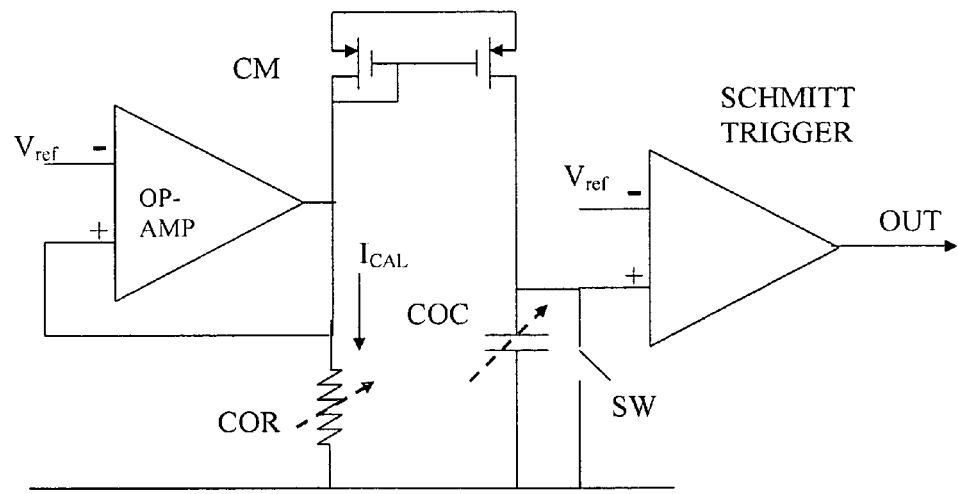
FIG. 1c shows a circuit that can be used with the present invention for determining whether the product (R)(C) meets certain requirements.

The embodiments involve calibrating the pole frequency of an active RC-filter or other such filter, e.g. a filter such as is illustrated in FIG. 1a in a negative feedback arrangement. Other arrangements of active filters can be envisaged. Since the pole frequency is (mainly) determined by the product (R)(C), this product usually needs to be calibrated, for example by generating a 1/R-dependent current and measuring the time to load a capacitor with this current or some other known way. An example of such a circuit is shown in FIG. 1c. Other circuits may be used for use with the present invention. The circuit works in the following way. A current $I_{cal}$ flows through a resistor COR that is the same as the resistor R1 used in the RC feedback circuit of FIG. 1a. The value of $I_{cal}$ is Vref/COR. Optionally, COR may be made variable and settable. The current $I_{cal}$ is mirrored by a current mirror CM and is used to charge a copy (COC) of the capacitor C1 of the RC circuit of FIG. 1a. Optionally, COC may be made variable and settable. The capacitor COC is made part of a Schmitt trigger circuit. When the switch SW is opened, the capacitor COC begins to charge up with the current $I_{cal}$. Hence the voltage will rise at a rate determined by Vref/COR. The value of the voltage reached after a time t will depend upon the time t and the product of (COR)(COC). Hence, by monitoring the time t at which a certain voltage has been reached or monitoring the voltage after a certain time, it can be determined if the value (COR)(COC) is within predetermined limits. If this value is outside tolerances, the value of COC is changed to bring the product (COR)(COC) back within tolerances. Then the value of C1 in the feedback circuit of FIG. 1a is changed to the newly set value of COC. For this purpose the values of C1 are made settable and adjustable. By this means the value of RC can be set or calibrated to a certain value. This can be done once during manufacture or can be done continuously in use. For example, this can involve external calibration circuitry used only at manufacturing time, or can involve on-chip circuitry to enable recalibration in the field. The latter is preferred as then compensations can be made for temperature changes, etc. In cases where fine resolution is needed, assuming perfect operational amplifiers, this calibration can be very precise (depending on inherent on-chip matching for example). In practice however, the finite gain-bandwidth product (GBW) of the operational amplifier also influences the pole frequency and embodiments of the invention involve reducing the effect of this variation. Amplifiers may be used with the present invention having their GBW determined by Gm/C. The proposed biasing technique for the operational amplifier aims to keep the gain-bandwidth product constant across different devices by compensating for manufacturing variations. In some embodiments, this biasing can be based on the already available RC-calibration to thereby reduce the overall pole frequency variation without serious increase in complexity of the circuits. Another option is to determine a calibration value separately from the RC calibration, though this would typically involve more complex circuitry, and thus more manufacturing expense.

The minimization or reduction of the pole frequency variation in active RC filters involves more precise setting or controlling of the bandwidth of such a filter compared to prior art solutions which only calibrate for RC variations owing to manufacturing process variation. For example, the differences due to Op-amp GBW variations between different devices can be reduced thus reducing the need for an additional margin on this filter bandwidth at the system level. This in turn can mean less or no need for extra filter orders (which need extra area and power consumption) or less loss in performance. Calibration of the Op-amp GBW with an additional calibration circuit is included within the scope of the present invention. This type of calibration can be combined with embodiments of the present invention which make use of existing values from the RC calibration, but has the disadvantage of adding to the complexity, area and current consumption of the device.

Figure 2:
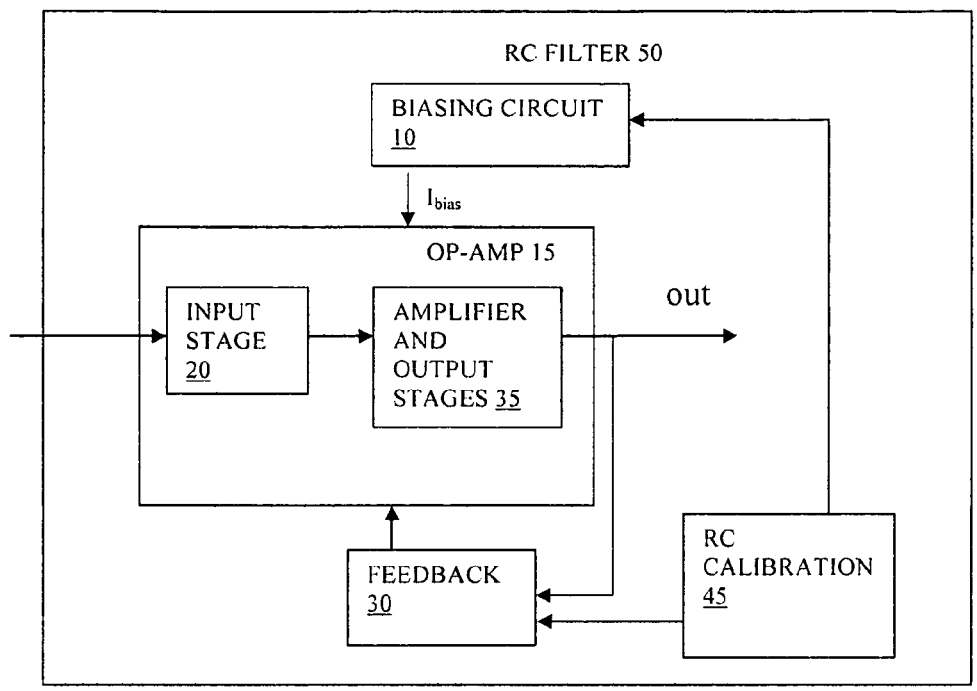
FIG. 2 shows an active filter according to an embodiment.

A first embodiment is shown in FIG. 2. This shows in schematic form an active filter 50 having an op-amp 15, and a negative feedback 30 from the output to any part of the op-amp. The op-amp can have an optional input stage 20, and amplifier and output stages 35. An RC calibration part 45 is coupled to the feedback part to enable the feedback to be tuned to compensate for manufacturing variations. The feedback can be regarded as including components such as R1 in the input path as shown in FIG. 1a. This RC calibration part can be implemented for example as circuitry to enable the values of the feedback components to be measured accurately as described above with reference to FIG. 1c. The RC calibration part can include measurement circuitry for carrying out the measurement on-chip. This can also involve isolating the components or providing test access points for external test instruments. The calibration part can also have components for adjusting the values of the components of the feedback loop such as R1 and or C1 according to the test results. These can be implemented with conventional hardware following established practice.

A biasing circuit 10 is shown coupled to the amplifier stage. In principle, variants can be envisaged in which this biasing circuit is coupled to other parts of the op-amp. The bias can be input at any point in the input stage or at the opamp with the purpose to control the GBW, which is, in embodiments of the present invention, determined by Gm/C with the Gm being the transconductance of the input stage. Thus by controlling the bias current of the input stage, it's Gm can be adjusted and thus the GBW. This is quite general for an opamp, where the GBW is usually determined by a Gm/C. This biasing circuit can help solve the problem of filter pole frequency variation. For example this can be done in accordance with one embodiment of the present invention without requiring extra (or significant) calibration circuitry or requiring higher current consumption. For example, the biasing circuit can use values obtained from the RC calibration circuitry.

Figure 3:
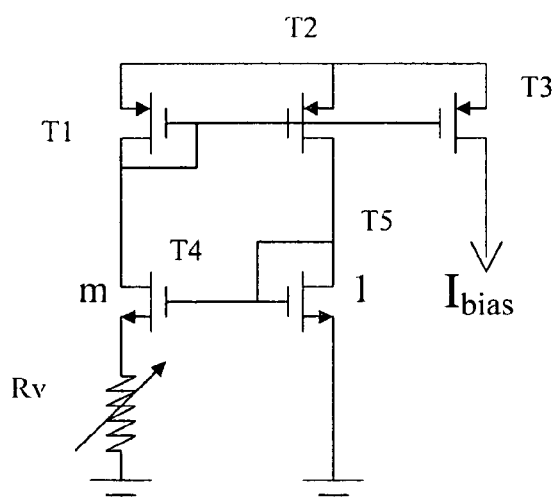
FIG. 3 shows a biasing circuit for the embodiment of FIG. 2.

An example of implementation of the biasing circuit 10 will be explained in more detail with reference to FIG. 3. With reference to the embodiment of this figure, an op-amp is to be used in an active RC filter, e.g. a shown in FIG. 1a and is a Miller compensated OTA, (operational transconductance amplifier). The OTA's transconductance parameter is controlled by an external current $I_{bias}$, the amplifier bias current.

The Gain-Bandwidth product GBW is given by $$\frac{g_{m,in}}{2\pi C_{ni}}$$

whereby $g_{m,in}$ is the transconductance of the input stage. The current generation for this input stage is made with the biasing circuit 10 that keeps $(g_m)(R)$ constant. Because the product RC has been set to a constant by means of the RC calibration circuitry, this means that by keeping $(g_m)(R)$ constant, $g_m/C$ is kept constant as well. Thus the present invention in one embodiment makes use of the calibration of the product RC to a constant value to also keep $g_m \cdot R$ constant to thereby keep $g_m/C$ constant and so calibrate the (transconductance) GBW of the OTA. For example, the biasing circuit of FIG. 3 can perform this task. FIG. 3 shows a circuit for generating a current $I_{bias}$ according to a value of a variable resistance. A pair of transistors T1 and T2 have gates and sources coupled together. They feed an output transistor T3, which has its gate and source coupled to those of T1 and T2. The drains of T1 and T2 are coupled to the drains respectively of transistors T4 and T5. T4 and T5 have their gates coupled together and are dimensioned to have gains in a ratio of m:1 respectively. The value of m is selected so that the appropriate level of output current $I_{bias}$ is obtained for the relevant op-amp, i.e. the current is determined by the ratio m and the value of the resistance. A variable resistor Rv is coupled in series with T4.

In this embodiment the same calibration resistance value obtained from the RC calibration circuit that is used to set the negative feedback circuit component values such as R1 and C1 of FIG. 1a is used to adjust the value of $I_{bias}$. By using the same calibration bits obtained by the RC calibration circuitry to tune the resistor Rv used in this $(g_m)(R)$-constant bias cell, the resulting current will keep $g_m/C$ (and thus the opamp GBW) constant over process variations. For example, the compensation of the RC-product, the value of COR from FIG. 1b, is used to set the value of the variable capacitor COC to thereby adapt its capacitance value. For the compensation of the GBW of the amplifier, the same calibration information, e.g. digital bits, are used to adapt the resistor value of the variable resistor Rv in the biasing cell. Hence, one set of bits that are used to adapt the capacitance (COC), are reused in the biasing cell to change the resistor value there. Setting Rv determines the value of $I_{bias}$. The resulting output current $I_{bias}$ is used as an input to the OTA of the active filter to adjust its transconductance and hence to keep $g_m/C$ (and thus the opamp GBW) constant despite process variations between devices.

Embodiments of the present invention can limit GBW variations to ±10% or better where the GBW is determined by controlling on the value of $g_m/C$ and only using a calibration of the RC time constant, which in itself only has a ±5% accuracy. This can be compared with other biasing techniques which inherently do not compensate $g_m/C$ variations and which can easily account for changes of up to ±40 to 50%.

An active filter, and a method of calibrating the filter to set its pole frequency or frequencies more precisely is described above. Additional features can be the filter being an RC filter and having an RC calibration circuit arranged to tune the (R)(C) product. The biasing circuit can be operable according to an output of the RC calibration circuit. An active filter can include an input stage with an amplifier such as an opamp. The op-amp can comprise a transconductance amplifier. The biasing circuit can be arranged to maintain a product of resistance and transconductance at the input stage, e.g. of the transconductance amplifier, to a constant value or within a range. Alternatively the biasing circuit can be arranged to maintain a transconductance divided by a capacitance of the input stage, e.g. of the transconductance amplifier, to a constant value or within a range.

The biasing circuit can comprise a current generator for inputting to the input stage, e.g. to the op-amp. The op-amp can have a GBW proportional to transconductance divided by a capacitance C, and the biasing circuit can be arranged to maintain the transconductance divided by the capacitance C to a constant value or a constant value within a tolerance, e.g. within plus or minus 10%. The biasing circuit can have a tunable resistor tunable according to a calibration signal obtained from the RC calibration circuit.

The active filter can be implemented using conventional hardware, and using any appropriate integrated circuit technology such as CMOS, bipolar or other analog circuitry technology.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. An active RC filter comprising:
    a first stage comprising an amplifier with a transconductance;
    a biasing circuit biasing the first stage to set a gain bandwidth product of the first stage to a first desired value or to set the gain bandwidth product within a first desired range of values of the gain bandwidth product; and
    an RC calibration circuit coupled to the biasing circuit and to the first stage, the RC calibration circuit comprising a calibration resistor and a calibration capacitor, the RC calibration circuit adapted to tuning a resistance value of the calibration resistor and a capacitance value of the calibration capacitor, wherein the capacitance value determines, at least partially, the gain bandwidth product.

2. The active RC filter of claim 1, wherein the first desired range of the gain bandwidth product is within ±10% of the first desired value.

3. The active RC filter of claim 1, wherein the biasing circuit biases the first stage according to an output of the RC calibration circuit.

4. The active RC filter of claim 3, wherein the biasing circuit maintains a constant second value or the biasing circuit maintains a second value within a second desired range of values of the second value, the second value being a product of the resistance value and the transconductance, the maintaining comprises obtaining calibration information from the output of the RC calibration circuit.

5. The active RC filter of claim 3, wherein the biasing circuit maintains a first ratio of the transconductance to the capacitance value at a constant third value or the biasing circuit maintains the first ratio within a third desired range of values of the first ratio, the maintaining comprises obtaining calibration information from the output of the RC calibration circuit.

6. The active RC filter of claim 1, wherein the biasing circuit comprises a current generator for supplying a bias current to the first stage.

7. The active RC filter of claim 1, wherein the gain bandwidth product is proportional to a second ratio of the transconductance divided by the capacitance value, and the biasing circuit maintains the second ratio at a constant fourth value or the biasing circuit maintains the second ratio within a fourth desired range of values of the second ratio, the maintaining being performed by supplying a bias current to the first stage.

8. The active RC filter of claim 3, wherein the biasing circuit comprises a tunable resistor that is tunable according to the calibration information obtained from the output of the RC calibration circuit.

9. The active RC filter of claim 8, wherein the gain bandwidth product is proportional to a third ratio of the transconductance divided by the capacitance value, and the biasing circuit maintains the third ratio at a constant fifth value depending on the calibration signal or the biasing circuit maintains the third ratio within a fifth desired range of values of the third ratio depending on the calibration signal, the maintaining comprises utilizing the output of the RC calibration circuit.

10. An integrated circuit having the active RC filter of claim 1.

11. A method of calibrating an active RC filter comprising a first stage with an amplifier, a RC calibration circuit, and a biasing circuit coupled to the first stage and to the RC calibration circuit, the biasing circuit arranged to bias a gain bandwidth product of the first stage, the amplifier having a transconductance, the RC calibration circuit comprising a resistor having a resistance value and a capacitor having a capacitance value, the method comprising steps of:
    controlling an output of the biasing circuit coupled to the first stage and to the RC calibration circuit to set the gain bandwidth product to a first desired value or to set the gain bandwidth product within a first desired range of values of the gain bandwidth product; and
    adjusting the gain bandwidth product using the RC calibration circuit, wherein the controlling step comprises operating the biasing circuit according to an output of the RC calibration circuit coupled to the biasing circuit and to the first stage.

12. The method of claim 11, wherein the adjusting step comprises tuning the resistance value and the capacitance value of the RC calibration circuit to maintain a product of the resistance value and the capacitance value at a constant value.

13. The method of claim 11, further comprising maintaining a constant second value or maintaining the second value within a second desired range of values of the second value, the second value being a product of the resistance value and the transconductance, the maintaining comprises obtaining the output from the RC calibration circuit.

14. The method of claim 11, further comprising maintaining a first ratio of the transconductance to the capacitance value at a constant third value or maintaining the first ratio within a third desired range of values of the first ratio, the maintaining comprises obtaining the output from the RC calibration circuit.

15. The method of claim 11, further comprising supplying a bias current to the first stage.

16. The method of claim 11, wherein the gain bandwidth product is proportional to the transconductance divided by the capacitance value, and further comprising supplying a bias current to the first stage to maintain a second ratio of the transconductance divided by the capacitance value at a constant fourth value or to maintain the second ratio within a forth desired range of values of the second ratio.

17. The method of claim 11, wherein the biasing circuit comprises a resistor, and wherein the method further comprises tuning the resistor of the biasing circuit according to a calibration signal obtained from the output of the RC calibration circuit.

18. The method of claim 11, the first stage having a gain bandwidth product proportional to a third ratio of the transconductance divided by the capacitance value, and further comprising maintaining the third ratio at a constant fifth value depending on the calibration signal or maintaining the third ratio within a fifth desired range of values of the third ratio depending on the calibration signal, the maintaining being performed by obtaining the output from the RC calibration circuit.

19. An active filter having at least one pole frequency, the active filter comprising:
    a first stage with an amplifier;
    a biasing circuit to bias the first stage to thereby set and/or maintain a gain bandwidth product of the first stage to obtain the at least one pole frequency or to obtain the pole frequency within a desired range of frequencies of the pole frequency; and
    an RC calibration circuit coupled to the first stage and the biasing circuit, the RC calibration circuit comprising:
        a resistor having a resistance value;
        a capacitor having a capacitance value; and
        calibration circuitry to tune the resistance value and the capacitance value.

20. A method of calibrating an active filter having at least one pole frequency, the active filter comprising a first stage with an amplifier, a biasing circuit to bias the first stage, and an RC calibration circuit coupled to the biasing circuit and the first stage, the RC calibration circuit comprising a resistor having a resistance value and a capacitor having a capacitance value, the method comprising:
    setting and/or maintaining a gain bandwidth product of the input stage to thereby obtain the at least one pole frequency or to obtain the at least one pole frequency within a desired range of frequencies of the at least one pole frequency;
    tuning the capacitance value and the resistor value using calibration circuitry coupled to the RC calibration circuit; and
    operating the biasing circuit according to an output of the calibration circuitry.

\* \* \* \* \*